United States Patent
Kim et al.

(10) Patent No.: US 6,514,827 B2
(45) Date of Patent: Feb. 4, 2003

(54) METHOD FOR FABRICATING A DUAL METAL GATE FOR A SEMICONDUCTOR DEVICE

(75) Inventors: Tae Kyun Kim, Kyoungki-do (KR); Se Aug Jang, Kyoungki-do (KR); Tae Ho Cha, Kyoungki-do (KR); In Seok Yeo, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/034,529

(22) Filed: Dec. 28, 2001

(65) Prior Publication Data

US 2002/0086445 A1 Jul. 4, 2002

(30) Foreign Application Priority Data

Dec. 29, 2000 (KR) ............................................. 00-85605

(51) Int. Cl.⁷ .................. H01L 21/336; H01L 21/3205; H01L 21/4763
(52) U.S. Cl. ...................... 438/292; 438/303; 438/305; 438/306; 438/592; 438/593
(58) Field of Search ................................ 438/592, 593, 438/199, 229, 230, 271, 232, 292, 303, 305, 306

(56) References Cited

U.S. PATENT DOCUMENTS

| | | | |
|---|---|---|---|
| 5,397,909 A | * 3/1995 | Moslehi | 257/383 |
| 5,447,874 A | 9/1995 | Grivna et al. | |
| 6,037,245 A | 3/2000 | Matsuda | |
| 6,043,157 A | 3/2000 | Gardner et al. | |
| 6,066,533 A | 5/2000 | Yu | |
| 6,093,628 A | * 7/2000 | Lim et al. | 438/592 |
| 6,130,123 A | * 10/2000 | Liang et al. | 438/217 |
| 6,177,336 B1 | * 1/2001 | Lin et al. | 438/592 |
| 6,187,657 B1 | 2/2001 | Xiang et al. | |
| 6,194,299 B1 | * 2/2001 | Buynoski | 438/592 |
| 6,211,026 B1 | * 4/2001 | Ahmad et al. | 438/300 |
| 6,214,680 B1 | * 4/2001 | Quck et al. | 438/300 |
| 6,291,282 B1 | * 9/2001 | Wilk et al. | 438/203 |
| 6,303,447 B1 | * 10/2001 | Chhagan et al. | 438/299 |
| 6,333,249 B2 | * 12/2001 | Kim et al. | 438/592 |
| 6,344,382 B1 | * 2/2002 | Wu et al. | 438/220 |

FOREIGN PATENT DOCUMENTS

JP          036592          2/2000

* cited by examiner

Primary Examiner—Jerome Jackson
Assistant Examiner—Shrinivas H. Rao
(74) Attorney, Agent, or Firm—Ladas & Parry

(57) ABSTRACT

A method for fabricating a dual metal gate structure for a semiconductor device including deposition of a semiconductor substrate having PMOS and NMOS regions, a first gate having a first insulating layer and a first metal layer is formed in a first region. The first region is either the PMOS or NMOS region, and the remaining region becomes a second region. A dummy gate is formed in the second region. A spacer and a source/drain region are formed for each of the first and dummy gates. The dummy gate, however, is removed to expose a portion of the substrate in the second region. A second gate constructed of a second gate insulating layer and a second metal layer is then formed on the exposed portion of the substrate in the second region.

10 Claims, 7 Drawing Sheets

METHOD FOR FABRICATING A DUAL METAL GATE FOR A SEMICONDUCTOR DEVICE

BACKGROUND OF THE INVENTION

1. Field of the Invention

The present invention relates generally to a method for forming a gate structure of a semiconductor device, and more particularly, the present invention relates to a method for fabricating a dual metal gate by using a damascene process.

2. Description of the Related Art

Recently, as development of semiconductor devices on the level of sub-0.1 micron has begun in earnest, a conventional gate electrode made of polysilicon or metal silicide has reached several physical limits.

For example, the polysilicon gate has problems, such as an increase in effective thickness of a gate insulating layer due to a gate depletion phenomenon, penetration of dopants from the p+ or n+ polysilicon gate to a substrate, and variation in the threshold voltage caused by a change of dopant distribution. In addition, the polysilicon gate is not suitable for realizing low resistance levels required for reductions in line width.

Thus, there has arisen a need for a new gate electrode with a new material or a new structure as an alternative to conventional gates. To meet such need, a metal gate electrode has been introduced and developed in the field. Since no dopant is basically required for the metal gate electrode, the above-noted problems existing in conventional gates are solved naturally.

Furthermore, the conventional metal gate electrode permits formation of a single metal gate in which a threshold voltage is symmetrically formed in the NMOS and PMOS regions by using metal with a value of the work function at an intermediate band gap of silicon. The metal gate electrode may be made of various metal, such as W, WN, Ti, TiN, Mo, MoN, Ta, TaN, $Ti_3Al$ and $Ti_3AlN$.

Unfortunately, when a single metal gate is employed for a CMOSFET device, a flat band voltage is decreased in the NMOS and PMOS regions and consequently, the threshold voltage is increased. In order to reduce the threshold voltage, a buried channel is formed through counter doping. However, this gives rise to increases of a short channel effect and a leakage current in the CMOSFET device.

Accordingly, a new attempt to form a dual metal gate has been made by separately using different kinds of metal gates with different values of the work function in the respective NMOS and PMOS regions, based upon the operational principle of an existing dual polysilicon gate.

FIGS. 1A to 1E show the steps of a method for fabricating a conventional dual metal gate of the semiconductor device according to the prior art.

Figure 1A:
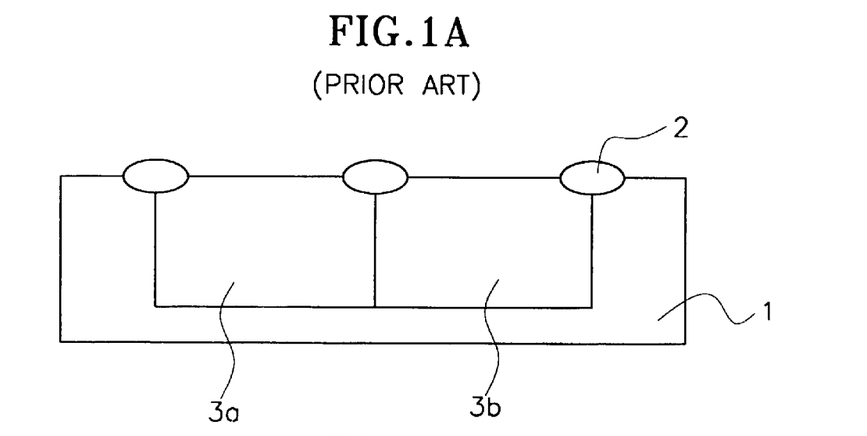
FIGS. 1A to 1E are cross-sectional views showing in sequence the steps of a method for fabricating a conventional dual metal gate structure for a semiconductor device according to the prior art.

Referring to FIG. 1A, after a field oxide layer 2 is formed on a semiconductor substrate 1, an NMOS region 3a and a PMOS region 3b are separately formed in the semiconductor substrate 1 by using masking and ion-implanting processes well known in the art. Next, a thin screen oxide layer (not shown) is formed on the semiconductor substrate 1, and proper ions for adjusting a threshold voltage are implanted respectively into the NMOS and PMOS regions 3a and 3b by a photo masking process.

Figure 1B:
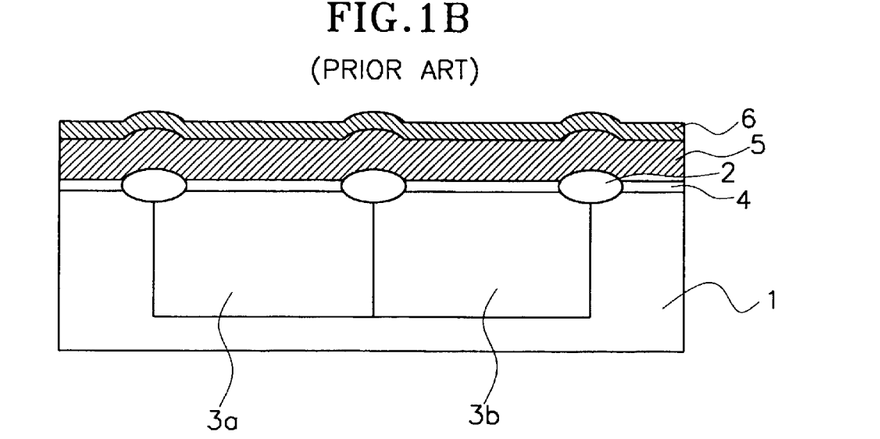
Figure 1C:
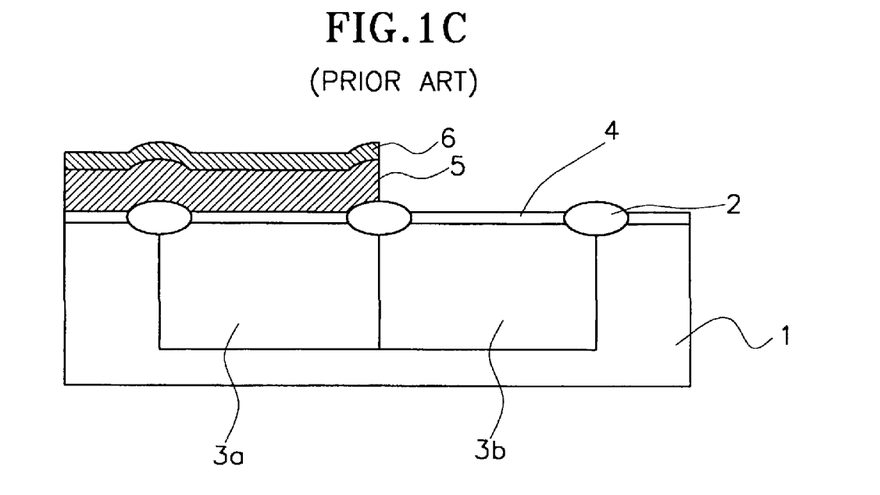

Then, after the screen oxide layer is removed, as shown in FIG. 1B, a gate insulating layer 4, a metal layer 5 for NMOS and a barrier metal layer 6 are sequentially formed over the entire semiconductor substrate 1. The metal layer 5, used for NMOS, comprises a metal having a Fermi energy near a conduction band of silicon.

Next, an appropriate first etch mask (not shown) is formed on the NMOS region 3a. Then, referring to FIG. 1C, the barrier metal layer 6 and the NMOS metal layer 5 are removed in sequence from the PMOS region 3b by a photo etching process using the first etch mask.

Figure 1D:
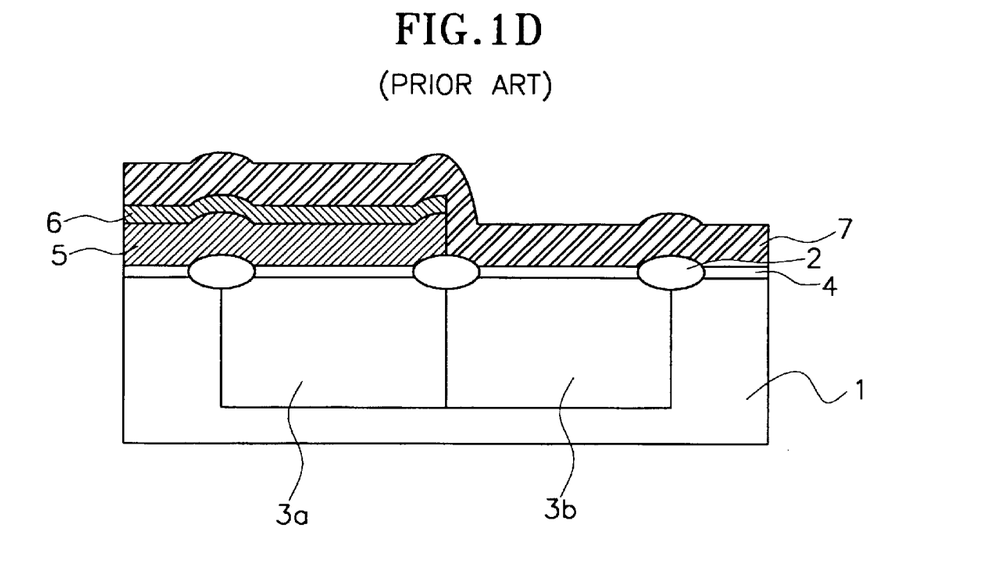

Thereafter, as shown in FIG. 1D, a metal layer 7, used for PMOS, is deposited over the entire resultant structure on the semiconductor substrate 1.

Then, an appropriate second etch mask (not shown) is formed on the PMOS metal layer 7. Next, referring to FIG. 1E, dual metal gates 8a and 8b are separately formed in the NMOS and PMOS regions 3a and 3b by a photo etching process using the second etch mask.

Figure 1E:
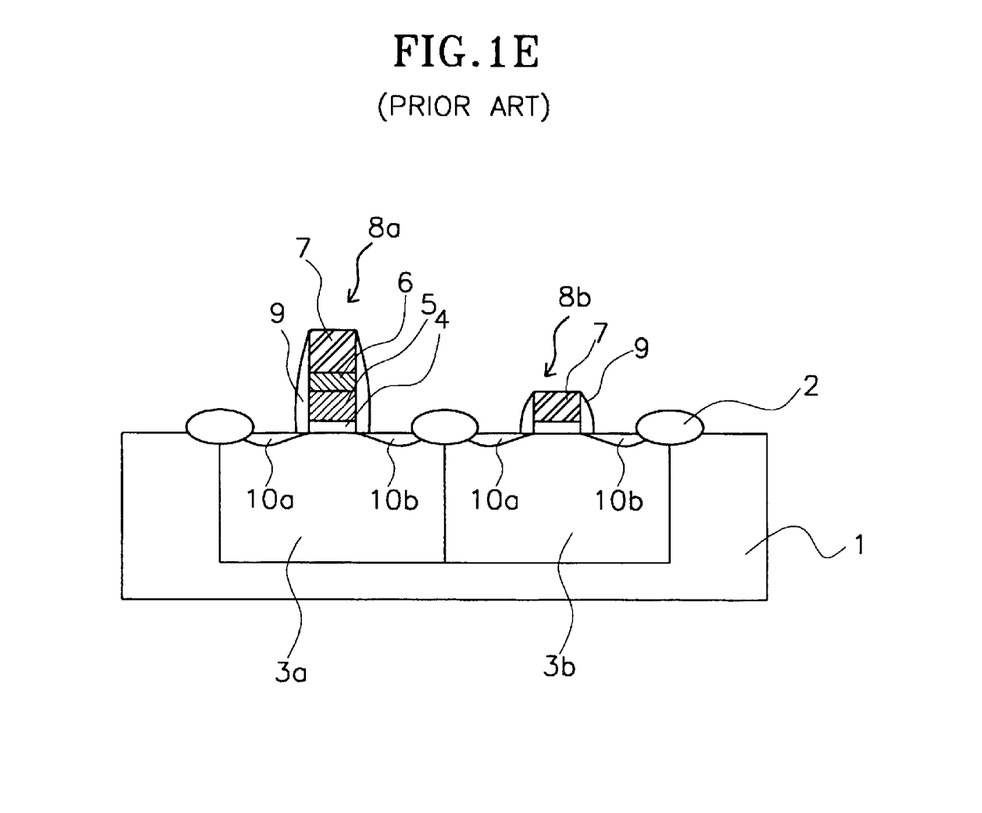

Subsequently, a spacer nitride is deposited over an entire resultant structure and then subjected to a blanket etching process. Therefore, a spacer 9 is formed on the lateral sidewalls of the dual metal gates 8a and 8b. Next, a source/drain region 10a and 10b is formed in each of the NMOS and PMOS regions 3a and 3b by a source/drain ion implantation process, so that fabrication of a CMOSFET device having dual metal gates is completed.

Unfortunately, the above-described conventional dual metal gate structure has several disadvantages. For example, when the NMOS and PMOS metal layers are patterned to form the metal gate, it is difficult to institute an etch recipe for the metal gate. Additionally, an etching process or an ion implantation process may create plasma damage, and a thermal process performed after formation of the metal gate may create thermal damage.

Furthermore, since the metal gate of the NMOS region is different from that of the PMOS region in height and material thereof, it is hard to reliably establish the etching process capable of preventing the semiconductor substrate from being damaged.

SUMMARY OF THE INVENTION

It is therefore an object of the present invention to provide an improved method for fabricating a dual metal gate structure for a semiconductor device while allowing simplified, stable and reliable process.

It is another object of the present invention to provide an improved method for fabricating a dual metal gate structure for a semiconductor device while minimizing damage of the gate caused by plasma or thermal ambience and thereby enhancing the profile and operating characteristics of the gate.

It is still another object of the present invention to provide an improved method for fabricating a dual metal gate structure for a semiconductor device while attaining a high degree of integration of the device.

These and other objects in accordance with the present invention are attained by a method using a damascene process to form a dual metal gate structure.

The method according to the present invention comprises providing a semiconductor substrate having a PMOS region and an NMOS region formed therein, and sequentially depositing a first gate insulating layer and a first metal layer over the semiconductor substrate. The first metal layer and the first gate insulating layer are then sequentially patterned, so that a first gate is formed in a first region, the first region being selected between either the PMOS region and the NMOS region, and a dummy gate is formed in the second region not selected as the first region. Next, a spacer is formed on each lateral sidewall of the first gate and the dummy gate, and a source/drain region is formed in the semiconductor substrate adjacent each side of the first gate and the dummy gate. Thereafter, an interlayer dielectric layer is deposited on the resultant structure, including over the source/drain region, and polished so as to expose the patterned first metal layer. The dummy gate is then removed so as to expose a portion of the semiconductor substrate in the second region. Next, a second gate insulating layer and a second metal layer are sequentially deposited on the exposed portion of the semiconductor substrate and the interlayer dielectric layer. Subsequently, the second metal layer and the second gate insulating layer are polished so as to expose the interlayer dielectric layer. Thereby, a second gate is established in the second region.

In the method, first and second metal layers may be used for NMOS and PMOS, respectively. The first metal layer for NMOS is preferably made of a metal having a work function value of 4.2 eV or less, while the second metal layer used for PMOS is preferably made of a metal having a work function value of 4.8 eV or greater. Alternatively, the first and second metal layers may be used for PMOS and NMOS, respectively, so that the definition of the first and second regions are reversed. In this case, the second metal layer for NMOS is preferably made of a metal having a work function value of 4.2 eV or less, and the first metal layer for PMOS is preferably made of metal having a work functional value of 4.8 eV or more.

According to an alternate embodiment of the present invention, another method for fabricating a dual metal gate structure for a semiconductor device is described. The alternate embodiment method comprises providing a semiconductor substrate having a PMOS region and an NMOS region formed therein, and sequentially depositing a first gate insulating layer, a first metal layer and a first mask layer on the semiconductor substrate. Next, after the first mask layer is patterned, the first metal layer and the first gate insulating layer are sequentially etched by using the patterned first mask layer as an etch barrier, so that a gate structure is formed respectively in the PMOS region and the NMOS region. A spacer is then formed on a lateral sidewall of the gate structure, and a source/drain region is formed in the semiconductor substrate adjacent appropriate sides of the gate structure. Thereafter, an interlayer dielectric layer is deposited on the resultant structure having the source/drain region, and this is polished together with the first mask layer so as to expose the etched first metal layer. Next, a second mask layer is partially deposited on the resultant structure so as to cover the exposed first metal layer in one region selected from either the PMOS region or the NMOS region, thereby defining a first region. The first metal layer and the first gate insulating layer are then sequentially etched by using the second mask layer as an etch barrier, so that a portion of the semiconductor substrate is exposed in the region not selected in the previous steps thereby defining a second region. A second gate insulating layer and a second metal layer are sequentially deposited over the exposed portion of the second region of the semiconductor substrate, the interlayer dielectric layer, and the second mask layer. Subsequently, the second metal layer, the second gate insulating layer, and the second mask layer are polished so as to expose the interlayer dielectric layer, thereby, completing formation of the dual gate structure.

Preferably, the first metal layer may be deposited with a thickness of between, 1000 and 3000 Å. The first and second metal layers may be used for NMOS and PMOS, so that the NMOS is defined as the first region and the PMOS is defined as the second region or alternatively for PMOS and NMOS, respectively, so that the definitions of the first and second regions are reversed. The metal layer for NMOS is preferably made of a metal having a work function value of 4.2 eV or less, while the metal layer for PMOS is preferably made of a metal having a work function value of 4.8 eV or greater.

In addition, the first gate insulating layer and the second insulating layer may be respectively made of a material selected from a group comprising oxide, oxy-nitride, and other materials having a high dielectric constant. Furthermore, the first mask layer and the second mask layer may be deposited respectively to a thickness of between 800 and 1000 Å, and the interlayer dielectric layer may be deposited to a thickness of between 4000 and 6000 Å. Etching of the first metal layer and the first gate insulating layer may be performed by a dry etch or a wet etch.

DETAILED DESCRIPTION OF THE INVENTION

The present invention will now be described more fully below with reference to accompanying drawings, in which preferred embodiments of the invention are shown. This invention, however, may be embodied in many different forms and should not be construed as limited to the embodiments set forth herein.

FIGS. 2A to 2I show in sequence the steps of a method for fabricating a dual metal gate structure for a semiconductor device, particularly by using a damascene process according to an embodiment of the present invention.

Figure 2A:
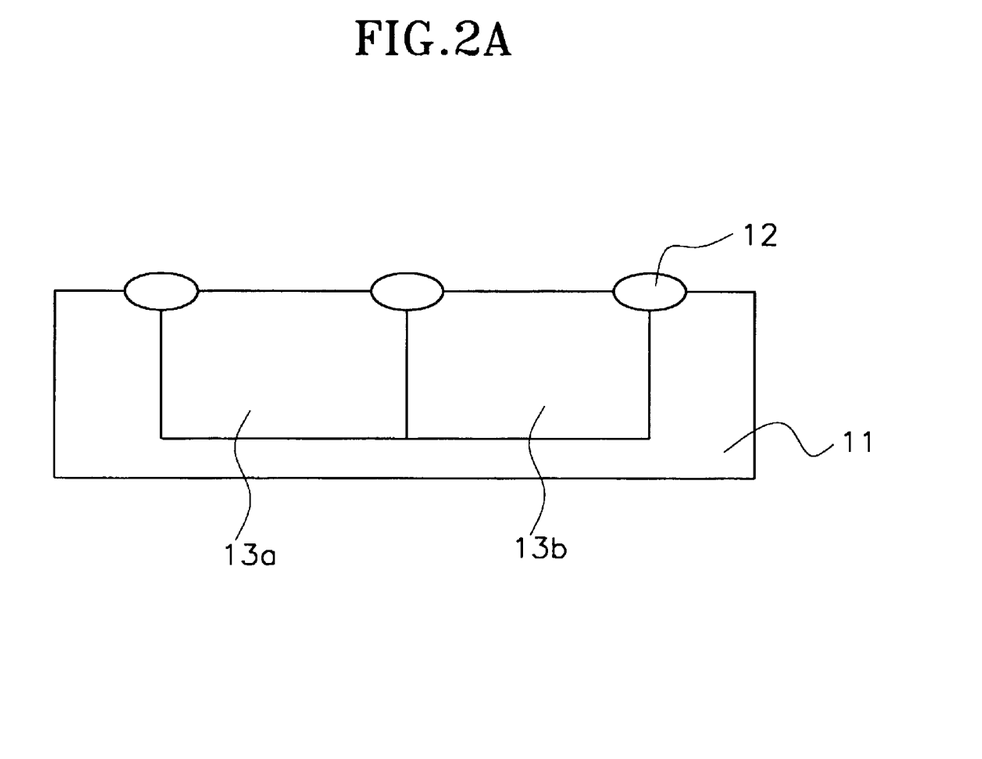
FIGS. 2A to 2I are cross-sectional views showing in sequence the steps of a method for fabricating a dual metal gate structure for a semiconductor device according to an embodiment of the present invention.

Referring to FIG. 2A, a semiconductor substrate 11 in which an active area and a field area are defined is provided, and thereafter a field oxide layer 12 is formed in the field area. Next, an n-well 13a and a p-well 13b are formed in the semiconductor substrate 11 by using masking and ion-implanting processes well known in the art. Hereinafter, the n-well 13a and the p-well 13b will be called a PMOS region and an NMOS region, respectively.

Figure 2B:
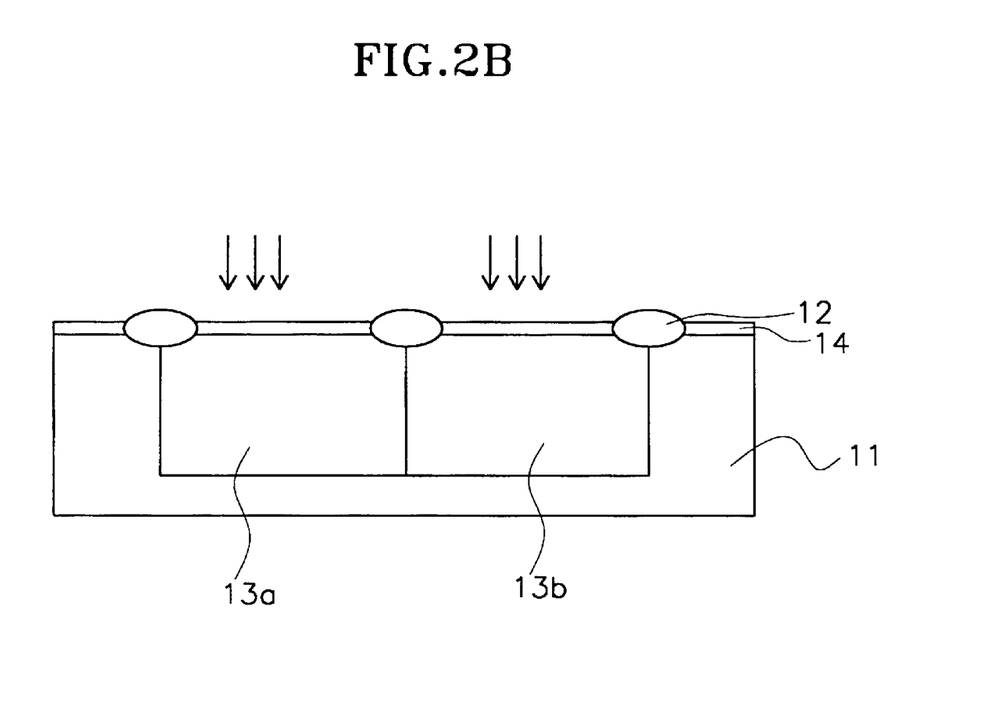

Next, as shown in FIG. 2B, a screen oxide layer 14 is formed on the semiconductor substrate 11 including over the PMOS and NMOS regions 13a and 13b. The screen oxide layer 14 preferably has a thickness of between 50 and 100 Å. The PMOS and NMOS regions 13a and 13b are then subjected to a photo masking process and an ion implantation process for adjusting threshold voltage. The screen oxide layer 14 is then removed. Preferably, arsenic (As) or phosphorus (P) are used as dopants for the PMOS region 13a, while boron (B) or boron difluoride ($BF_2$) are used as dopants for the NMOS region 13b.

Figure 2C:
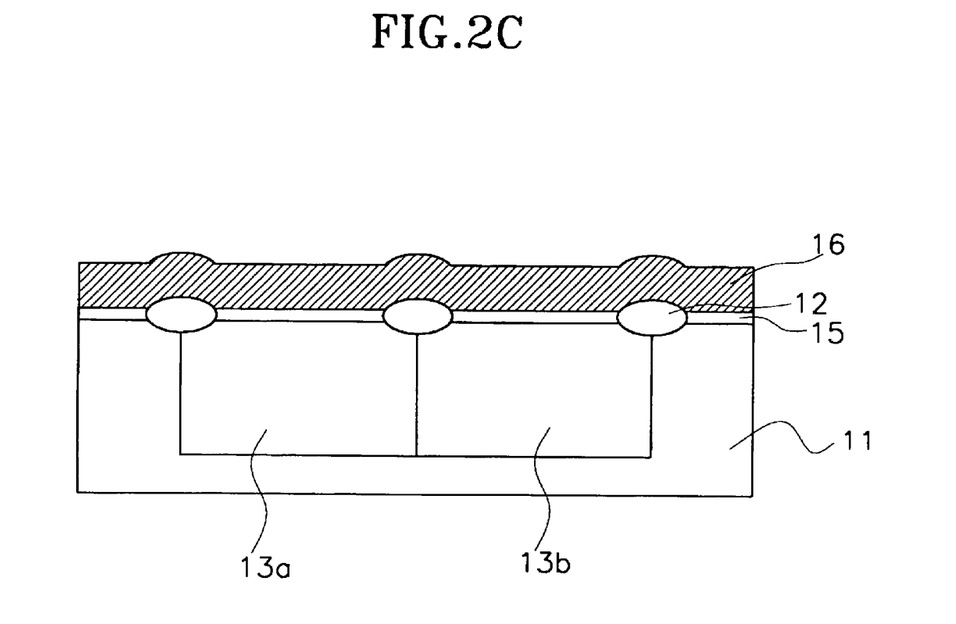

Next, as shown in FIG. 2C, a first gate insulating layer 15 and a first metal layer 16 are sequentially deposited over the entire semiconductor substrate 11, including over the PMOS and NMOS regions 13a and 13b. Preferably, the first gate insulating layer 15 is made of a material selected from a group including oxide, oxy-nitride, and other materials having a high dielectric constant.

The first metal layer 16 is used for NMOS in the present embodiment, but may be used for PMOS (not shown) in alternative embodiments. The NMOS metal layer 16 is preferably made of a metal having a Fermi energy near a conduction band of silicon. That is, the metal used for the NMOS metal layer 16 has a work functional value of 4.2 eV or below. In addition, the first metal layer 16 may be deposited to a thickness of between 1000 and 3000 Å.

Figure 2D:
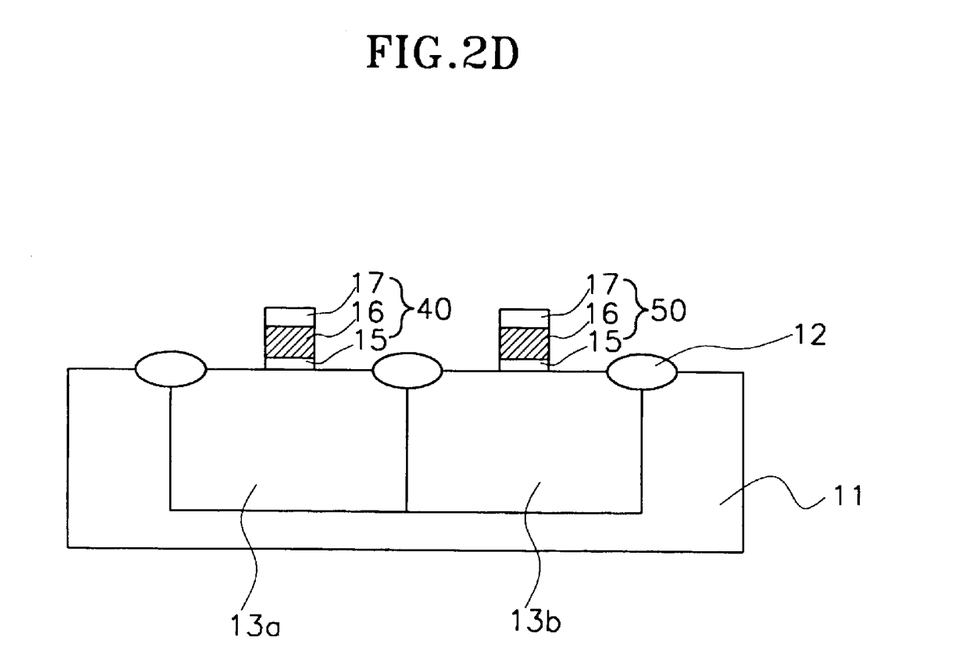

Next, referring to FIG. 2D, a first mask layer 17 is deposited over the first metal layer 16 on the PMOS and NMOS regions 13a and 13b. Preferably, the first mask layer 17 has a thickness of from 800 to 1000 Å. Then, the first mask layer 17 is patterned by etching through an appropriate etch mask (not shown) formed thereon.

Next, after the etch mask is removed, the first metal layer 16 and the first gate insulating layer 15 are sequentially etched by using the patterned first mask layer 17 as an etch barrier. Therefore, gate structures 40 and 50 are formed over the PMOS and NMOS regions 13a and 13b, respectively. The gate structure 40 in the PMOS region 13a acts as a dummy gate, while the gate structure 50 in the NMOS region 13b acts as a first gate of the dual gate structure.

Figure 2E:
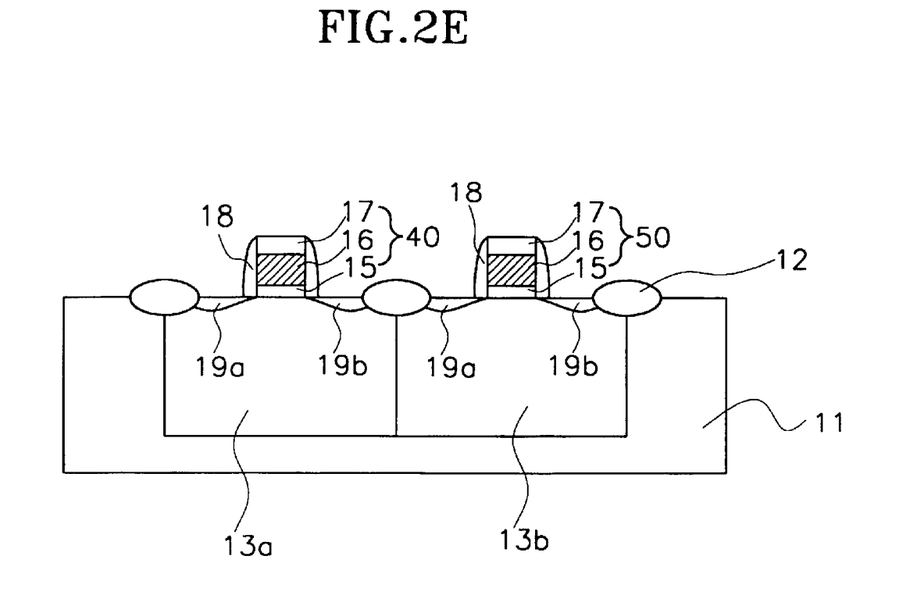

Thereafter, while the dummy gate 40 and the first gate 50 are used as an implant barrier, an appropriate impurity with low doping concentration is implanted into the semiconductor substrate 11 so as to form a lightly doped source/drain region. Next, a nitride layer is deposited over the entire resultant structure and blanket-etched. Therefore, as depicted in FIG. 2E, a spacer 18 is formed on each lateral sidewall of the dummy gate 40 and the first gate 50.

Then, with the spacer 18 being used as an implant barrier, an appropriate impurity with high doping concentration is implanted into the semiconductor substrate 11, so that heavily doped source/drain regions 19a and 19b are formed in the semiconductor substrate 11 at each side of the dummy gate 40 and the first gate 50.

Figure 2F:
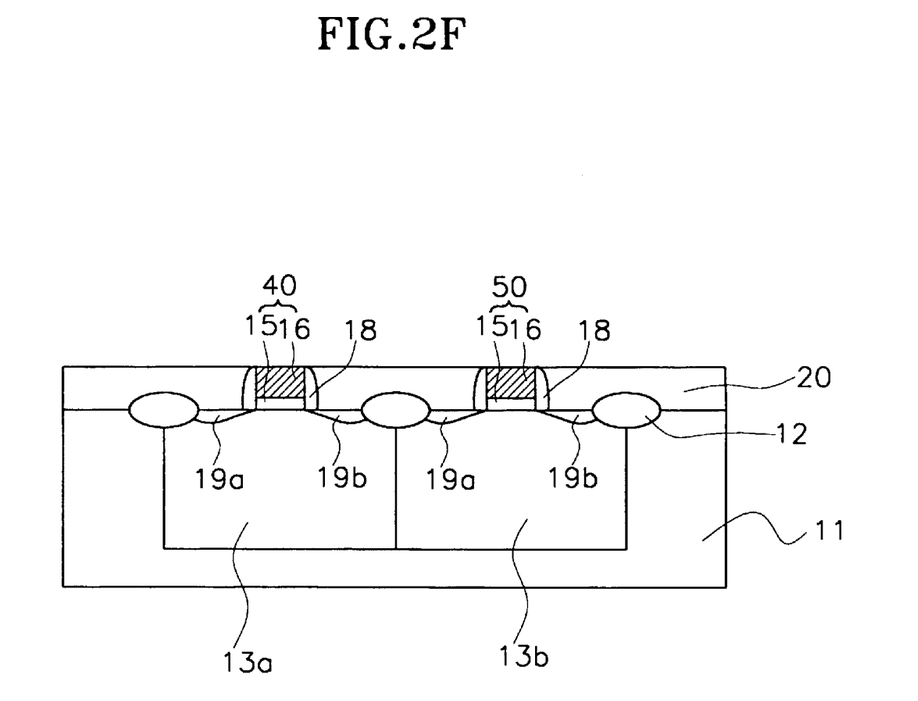

Next, referring to FIG. 2F, an interlayer dielectric layer 20 is deposited over the entire resultant structure, including the source/drain regions 19a and 19b. Preferably, the interlayer dielectric layer 20 has a thickness of from 4000 to 6000 Å. Then, the interlayer dielectric layer 20 is polished, together with the first mask layer, until the top surface of the etched first metal layer 16 is exposed.

Figure 2G:
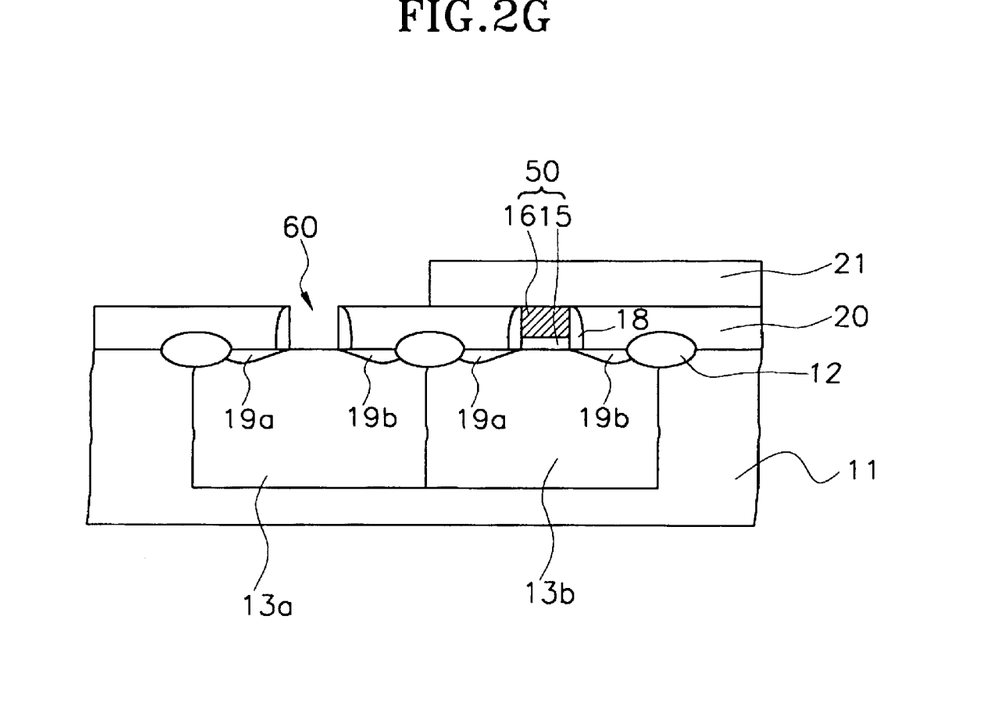

Next, one region, either the PMOS region 13a or NMOS region 13b, is masked. In the present embodiment, the NMOS region 13b, having the first gate 50 is covered with a second mask layer 21 as illustrated in FIG. 2G. That is, the second mask layer 21 is deposited to cover the exposed first metal layer 16 of the first gate 50. Preferably, the second mask layer 21 is deposited with a thickness of between 800 and 1000 Å.

Next, the first metal layer 16 and the first gate insulating layer 15 are wholly removed from the PMOS region 13a by a dry etch or a wet etch using the second mask layer 21 as an etch barrier. Accordingly, an opening 60 is formed in place of the removed dummy gate, and thereby a portion of the semiconductor substrate 11 is exposed by the opening 60 in the PMOS region 13a.

Figure 2H:
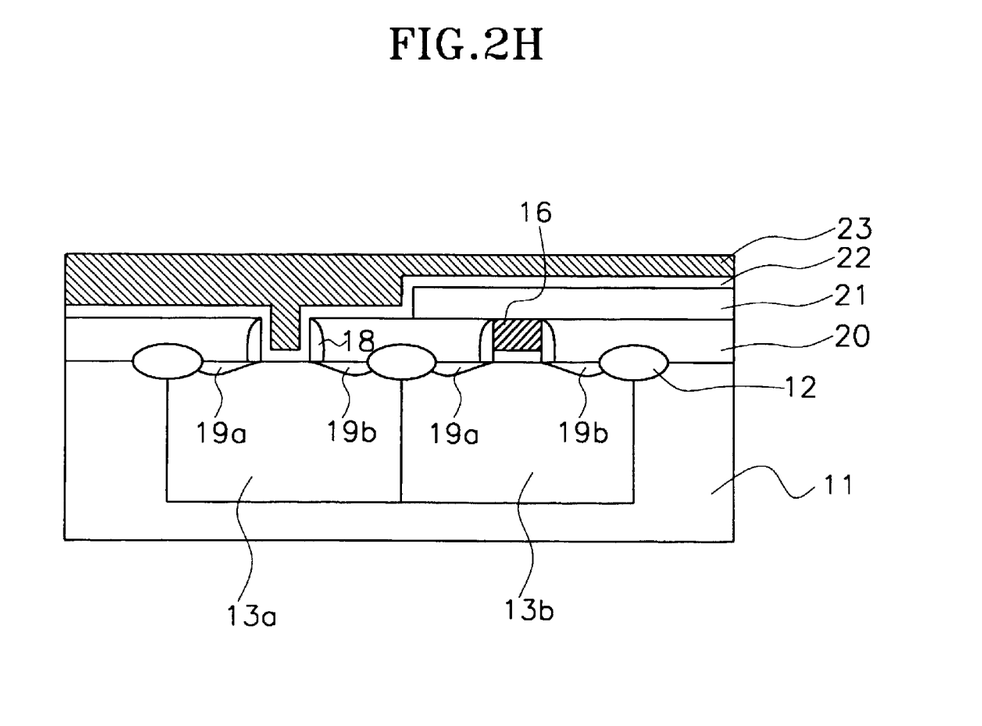

Then, as shown in FIG. 2H, a second gate insulating layer 22 and a second metal layer 23 are sequentially deposited on the exposed portion of the semiconductor substrate 11, the interlayer dielectric layer 20, and the second mask layer 21. Preferably, the second gate insulating layer 22 is made of a material selected from a group comprising oxide, oxy-nitride, and other materials with high dielectric constant.

The second metal layer 23 is used for PMOS in the present embodiment. The PMOS metal layer 23 is preferably made of metal having a Fermi energy near a valence band of silicon. That is, metal for the PMOS metal layer 23 has a work function value of 4.8 eV or greater.

Figure 2I:
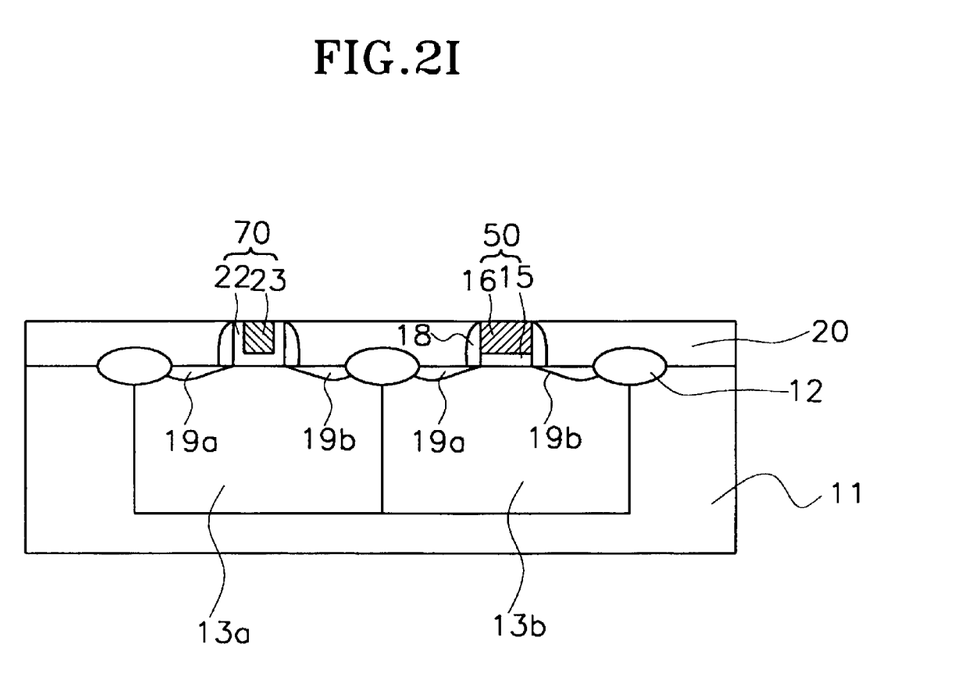

Referring now to FIG. 2I, the second metal layer 23, the second gate insulating layer 22, and the second mask layer 21 are polished until a top surface of the interlayer dielectric layer 20 is exposed. As a result, the second mask layer 21 is completely removed, and the second metal layer 23 and the second gate insulating layer 22 remain only in the opening 60 over the PMOS region 13a, thereby establishing a second gate 70 of the dual gate structure.

Though the first and second metal layers 16 and 23 are preferably used for NMOS and PMOS, respectively, in the present embodiment, the first and second metal layers may be used for PMOS and NMOS in alternative embodiments.

As described above in the example, the present invention provides a fabrication method of a dual metal gate structure by performing a damascene process so as to form the second gate of the dual metal gate in addition to a single gate fabrication process for forming the first gate of the dual metal gate structure. As a result, the entire fabrication process becomes simplified and stable.

Furthermore, since the damascene process allows a reduction in damage caused to the gate due to plasma or thermal ambience, the dual metal gate structure according to the present invention can have an excellent profile and improved operational characteristics.

Moreover, an effective solution or approach in the present invention to solve the unsatisfactory problems arising in the prior art may contribute to higher integration of the device.

What is claimed is:

1. A method for fabricating a dual metal gate structure for a semiconductor device, comprising the steps of:

providing a semiconductor substrate having a PMOS region and an NMOS region formed therein;

sequentially depositing a first gate insulating layer and a first metal layer having a work function value of 4.2 eV or less on the semiconductor substrate;

sequentially patterning the first metal layer and the first gate insulating layer, so that a first gate is formed in a first region, the first region being either the PMOS region or the NMOS region, and a dummy gate is formed in a second region, the second region being the other of the PMOS and NMOS regions;

forming a spacer on each lateral sidewall of the first gate and the dummy gate;

forming a source/drain region in the semiconductor substrate adjacent each side of the first gate and the dummy gate;

depositing an interlayer dielectric layer on the resultant structure to a thickness between 4,000 and 6,000 Å, including over the source/drain region;

polishing the interlayer dielectric layer so as to expose the patterned first metal layer;

removing the dummy gate so as to expose a portion of the semiconductor substrate in the second region;

sequentially depositing a second gate insulating layer and a second metal layer having a work function value of 4.8 eV or greater on a portion of the semiconductor substrate exposed due to removal of the dummy gate and the interlayer dielectric layer; and polishing the second metal layer and the second gate insulating layer so as to expose the interlayer dielectric layer, thereby establishing a second gate in the second region.

2. The method of claim 1, wherein the first metal layer is used for NMOS, there by defining the first region, and the second metal layer is used for PMOS, thereby defining the second region.

3. The method of claim 1, wherein the first metal layer is used for PMOS, thereby defining the first region, and the second metal layer is used for NMOS, thereby defining the second region.

4. A method for fabricating a dual metal gate structure for a semiconductor device, comprising the steps of:

providing a semiconductor substrate having a PMOS region and an NMOS region formed therein;

sequentially depositing a first gate insulating layer, a first metal layer having a work function value of 4.2 eV or less, and a first mask layer on the semiconductor substrate;

patterning the first mask layer;

sequentially etching the first metal layer and the first gate insulating layer by using the patterned first mask layer as an etch barrier, so that a first structure is formed respectively in the PMOS region and the NMOS region;

forming a spacer on each lateral sidewall the gate structure;

forming a source/drain region in the semiconductor substrate adjacent a side of the gate structure;

depositing an interlayer dielectric layer to a thickness between 4,000 and 6,000 Å on the resultant structure having the source/drain region;

polishing the interlayer dielectric layer and the first mask layer so as to expose the etched first metal layer;

partially depositing a second mask layer on the resultant structure so as to cover the exposed first metal layer in one region selected from either the PMOS region or the NMOS region, thereby defining a first region;

sequentially etching the first metal layer and the first gate insulating layer by using the second mask layer as an etch barrier, so that a portion of the semiconductor substrate is exposed in the region not selected in the previous step, thereby defining a second region;

sequentially depositing a second gate insulating layer and a second metal layer having a work function value of 4.8 eV or greater on the exposed portion of the semiconductor substrate, the interlayer dielectric layer, and the second mask layer; and polishing the second metal layer, the second gate insulating layer, and the second mask layer so as to expose the interlayer dielectric layer, thereby completing formation of the dual gate structure.

5. The method of claim 4, wherein the first metal layer is deposited to a thickness of between 1000 and 3000 Å.

6. The method of claim 4, wherein the first metal layer is used for NMOS, thereby defining the NMOS region as the first region and the second metal layer is used for PMOS, thereby defining the PMOS region as the second region.

7. The method of claim 4, wherein the first metal layer is used for PMOS, thereby defining the PMOS region as the first region, and the second metal layer is used for NMOS, thereby defining the NMOS region as the second region.

8. The method of claim 4, wherein the first gate insulating layer and the second insulating layer are respectively made of a material selected from a group comprising oxide, oxy-nitride, and a material having a high dielectric constant.

9. The method of claim 4, wherein the first mask layer and the second mask layer are deposited respectively to a thickness between 800 and 1000 Å.

10. The method of claim 4, wherein the etching of the first metal layer and the first gate insulating layer is performed by using either a dry etch or a wet etch.

* * * * *